(12) United States Patent
Toyoshima

(10) Patent No.: US 6,703,680 B2
(45) Date of Patent: Mar. 9, 2004

(54) PROGRAMMABLE ELEMENT PROGRAMMED BY CHANGES IN RESISTANCE DUE TO PHASE TRANSITION

(75) Inventor: Yoshiaki Toyoshima, Kashiwa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 41 days.

(21) Appl. No.: 10/029,718

(22) Filed: Dec. 31, 2001

(65) Prior Publication Data

US 2003/0123207 A1 Jul. 3, 2003

(30) Foreign Application Priority Data

Dec. 4, 2001 (JP) ........................... 2001-370245

(51) Int. Cl.$^7$ ........................... H01L 29/00; H01L 27/10
(52) U.S. Cl. ........................... 257/529; 257/209
(58) Field of Search ................. 257/209, 529, 257/665

(56) References Cited

U.S. PATENT DOCUMENTS

| | | | | |
|---|---|---|---|---|
| 5,376,820 A | * | 12/1994 | Crafts et al. | 257/529 |
| 5,882,998 A | * | 3/1999 | Sur et al. | 438/601 |
| 6,337,507 B1 | * | 1/2002 | Bohr et al. | 257/529 |

* cited by examiner

Primary Examiner—Tom Thomas
Assistant Examiner—Ori Nadav
(74) Attorney, Agent, or Firm—Oblon, Spivak, McClelland, Maier & Neustadt, P.C.

(57) ABSTRACT

A programmable element includes a resistive element having a polysilicon film and a metal silicide film or metal film stacked on the polysilicon film. The electric resistance of the resistive element is changed by changing the composition of the metal silicide film or metal film or the chemical bond state using heat, thereby programming on the basis of the change in the electric resistance of the resistor.

7 Claims, 5 Drawing Sheets

US 6,703,680 B2

PROGRAMMABLE ELEMENT PROGRAMMED BY CHANGES IN RESISTANCE DUE TO PHASE TRANSITION

CROSS-REFERENCE TO RELATED APPLICATIONS

This application is based upon and claims the benefit of priority from the prior Japanese Patent Application No. 2001-370245, filed Dec. 4, 2001, the entire contents of which are incorporated herein by reference.

BACKGROUND OF THE INVENTION

1. Field of the Invention

The present invention relates to a programmable element for changing a function or circuit arrangement by programming operation, a programmable circuit capable of changing its function or circuit arrangement after completion, and a semiconductor device including the above programmable element and programmable circuit and, more particularly, to an element used for a redundancy switching circuit for, for example, a field programmable gate array (FPGA) or memory array.

2. Description of the Related Art

Some semiconductor devices are designed to change their functions or circuit arrangements by programming operation after the devices are physically completed. For example, the logic operation of an FPGA is changed by performing predetermined programming operation for a manufactured semiconductor device. In general, in manufacturing large-scale memory devices, a defective portion produced in the manufacturing process is separated and replaced with a spare element prepared in advance to restore the overall function of the device, thereby improving the yield (this processing is called redundancy processing).

As such programming operations, several methods are known. The most popular technique used in redundancy processing for memory devices is to switch a circuit arrangement so as to blow and separate a fuse element corresponding to a defective portion by a method of blowing the fuse element by externally applying a laser beam onto it or a method of electrically blowing the fuse element and selecting a spare element prepared in advance in place of the defective portion.

FIG. 1A is a plan view showing an example of the arrangement of a typical conventional fuse element. FIG. 1B is a sectional view taken along a line 1B—1B in FIG. 1A. A fuse element 1 is formed by a conductor such as a metal interconnection or polysilicon member which has a narrow middle portion. One end and the other end of the fuse element 1 are electrically connected to interconnections 3-1 and 3-2, respectively, through contact holes 2-1 and 2-2 formed in an interlevel dielectric film 2.

A surface protective film 6 is formed on the interconnections 3-1 and 3-2 of the fuse element 1, and an opening window 4 is formed in a portion of the surface protective film 6 which is located on the fuse element 1. The fuse element 1 is irradiated with a laser beam through this opening window 4 to be cut (blown).

With a reduction in the size of each element formed in a semiconductor device and an increase in the scale of an integrated circuit, the number of fuse elements described above increases. Demands have therefore arisen for a reduction in the size of fuse elements.

In the above arrangement, however, in cutting the fuse element 1 by laser beam irradiation, in order to prevent peripheral elements other than the fuse element 1 from being damaged by irradiation, a predetermined inhibition region 5 (indicated by the dashed line) must be defined around the fuse element 1 to inhibit other elements from being arranged in the region 5. In addition, an electrical protective region (guard-ring) is often formed near an end portion of the inhibition region 5.

Furthermore, the convergence limitation of a laser beam that is applied to the fuse element 1 to blow it imposes a limitation on the size of the opening window 4. This makes it difficult to decrease the opening window 4. Moreover, since the fuse element 1 is irradiated with a laser beam to be blown, other structural elements such as elements and interconnections cannot be mounted on the fuse element 1.

According to the method of electrically blowing a fuse element, the problems originating from laser beam irradiation can be avoided. However, in order to prevent the fuse element from affecting peripheral portions upon fusing, an inhibition region in terms of design which is equivalent to the one required in the case of fusing by laser beam irradiation must be set.

Conventional fuse elements therefore suffer manifest difficulty in attaining a reduction in size. In addition, many design limitations are imposed on semiconductor devices having conventional fuse elements.

BRIEF SUMMARY OF THE INVENTION

According to an aspect of the present invention, there is provided a programmable element comprising a resistive element having a polysilicon film and a metal silicide film or metal film stacked on the polysilicon film, wherein an electric resistance of the resistive element is changed by causing the metal silicide film or metal film to undergo phase transition without blowing the metal silicide film or metal film using heat, thereby programming on the basis of the change in the electric resistance of the resistive element.

DETAILED DESCRIPTION OF THE INVENTION

Figure 1A:
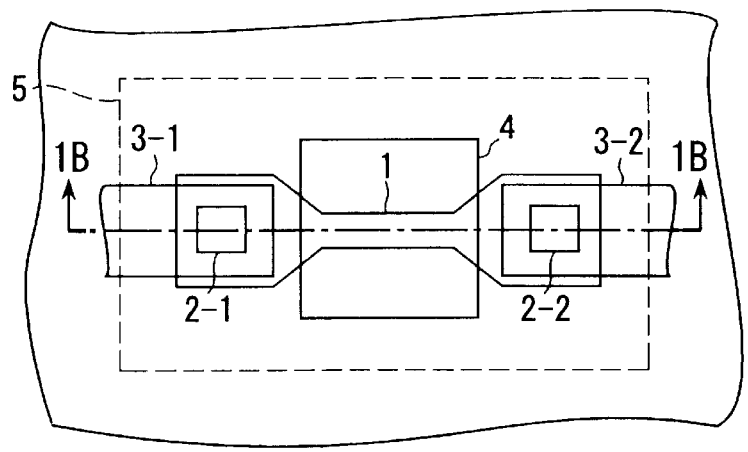
FIG. 1A is a plan view showing an arrangement of a typical conventional fuse element.
Figure 1B:
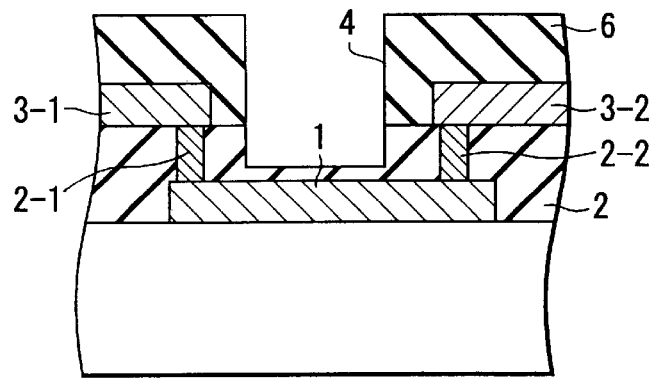
FIG. 1B is a sectional view taken along a line 1B—1B in FIG. 1A.
Figure 2A:
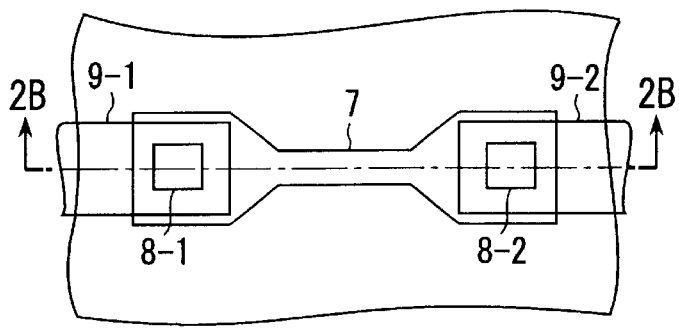
FIG. 2A is a plan view for explaining a programmable element according to the first embodiment of the present invention.
Figure 2B:
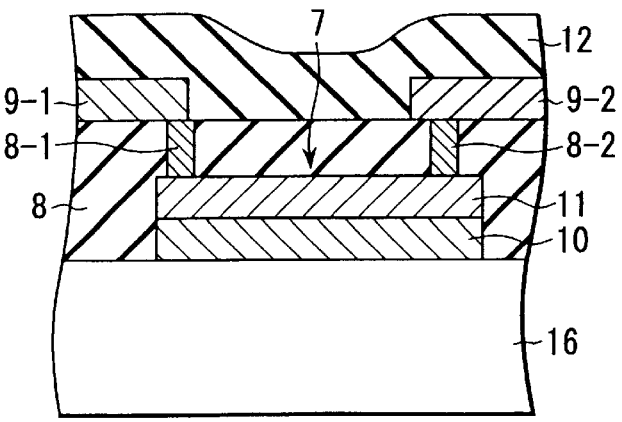
FIG. 2B is a sectional view taken along a line 2B—2B in FIG. 2A.

FIG. 2A is a plan view for explaining a programmable element according to the first embodiment of the present invention. FIG. 2B is a sectional view taken along a line 2B—2B in FIG. 2A.

A programmable element is formed on a substrate 16 obtained by, for example, forming an insulating film on a semiconductor substrate. This programmable element is comprised of a resistive element 7 and interconnections 9-1 and 9-2 electrically connected to the resistive element 7. The resistive element 7 is formed by stacking a polysilicon film 10 and nickel silicide film 11. An interlevel dielectric film 8 is interposed between the resistive element 7 and the interconnections 9-1 and 9-2. One terminal of the resistive element 7 and the interconnection 9-1 are electrically connected to each other through a contact hole 8-1 formed in the interlevel dielectric film 8. The other terminal of the resistive element 7 and the interconnection 9-2 are electrically connected to each other through a contact hole 8-2. The interconnections 9-1 and 9-2 are covered with a surface protective film 12.

Nickel silicide is known to take different phases of NiSi and $NiSi_2$ depending on its composition ratio; it takes the $NiSi_2$ phase upon heat treatment at 500° C. or higher, and the NiSi phase below 500° C. The two phases differ in resistivity. The NiSi phase exhibits about 20 $\mu\Omega$cm; and the $NiSi_2$ phase, about 60 $\mu\Omega$cm. That is, the NiSi phase is lower in resistance. In many integrated circuits, a low-resistance NiSi phase is formed on the surface of a gate electrode or source/drain diffusion layer to attain a decrease in the resistance of the electrode.

In the programmable element according to this embodiment of the present invention, therefore, the polysilicon film 10 having the same phase as that of the gate electrode and the nickel silicide film 11 having the NiSi phase are used as the resistive element 7 of the programmable element.

In programming, the resistive element 7 is self-heated by supplying a current to itself. When the temperature of this element exceeds a predetermined temperature (550° C. to 750° C.), phase transition from NiSi to $NiSi_2$ occurs (composition or chemical bond state change), and the resistance changes.

Figure 3:
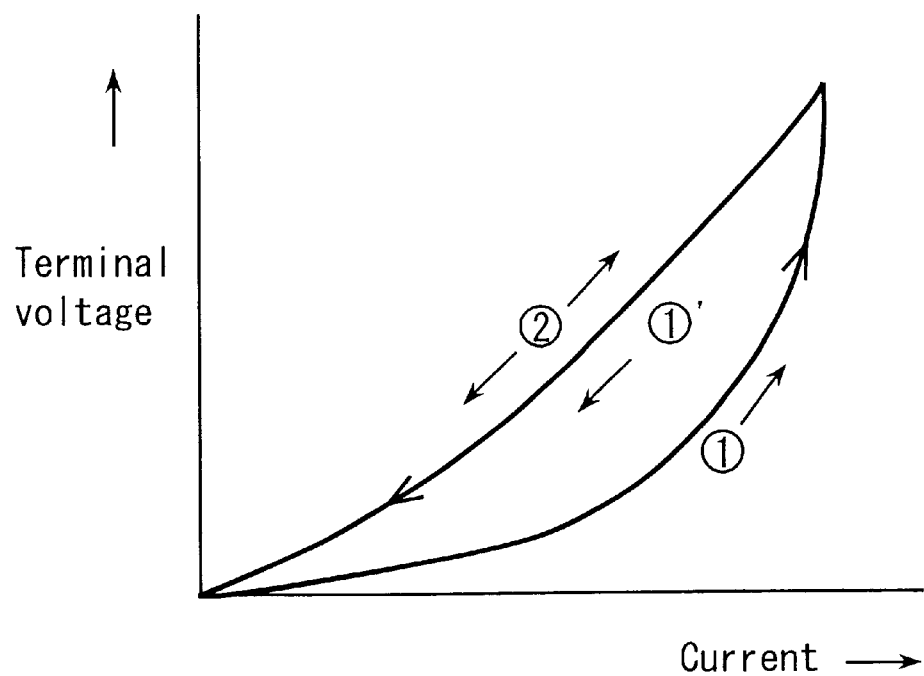
FIG. 3 is a graph showing current-voltage characteristics as a result of monitoring change in terminal voltages upon application of constant currents to a test resistive element.

FIG. 3 shows terminal voltage changes that occur when constant currents are supplied to a test resistive element. In this case, a small current is supplied, and its current value is increased at a constant rate. The terminal voltage rises with an increase in current. The relationship between them is not linear but exhibits a steep curve on the large-current side (see "①"). This is because the resistance increases due to heat generation and the above phase transition takes place. If, therefore, the current decreases, the terminal voltage does hot decrease in the same loop but decreases while a higher terminal voltage and higher resistance are maintained (see "①"). In addition, since the resistance changes constantly, when a current is supplied again, the terminal voltage follows a curve corresponding to a high resistance ("②"). This phenomenon makes it possible to recognize programming effect from a change in resistance upon supplying of a current. By detecting a change in resistance, therefore, a programming function equivalent to a fuse element can be implemented.

In the case of a conventional fuse element of a fusing type, a predetermined margin must be ensured not only above the fuse element but also around the fuse element, i.e., between the fuse element and structural elements such as other elements and interconnections, in order to prevent fusing from affecting the neighboring elements and the structure. However, the programmable element according to the present invention uses a change in resistance due to phase transition of a silicide film. Therefore, a change in the volume of the resistive element is small, and no design limitations need be imposed on portions above and around the programmable element. This makes it possible to achieve a reduction in the size of the programmable element and an increase in packing density.

Figure 4:
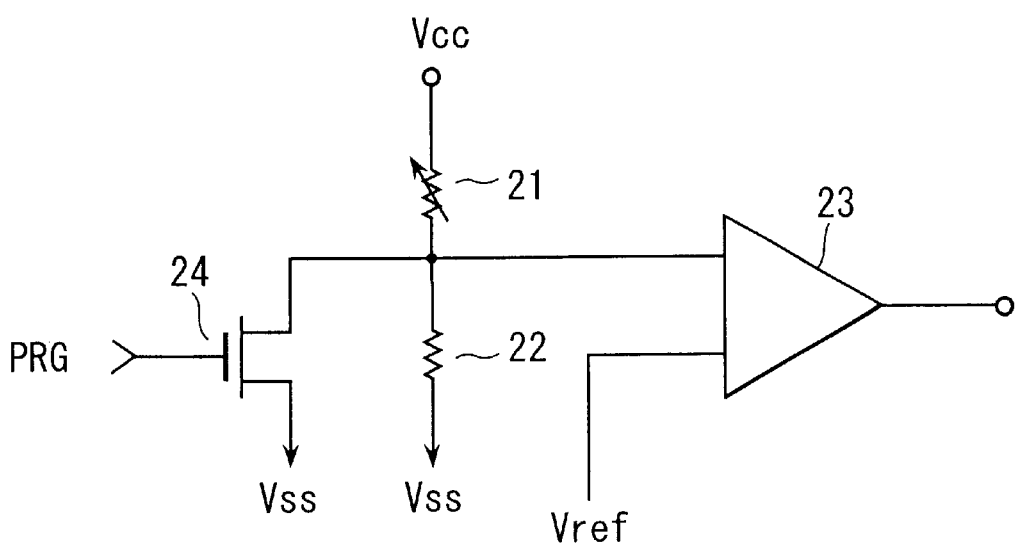
FIG. 4 is a view for explaining a programmable circuit and semiconductor device according to the first embodiment of the present invention, and more specifically, a circuit diagram showing the basic arrangement of the programmable circuit using the programmable element shown in FIGS. 2A and 2B.

FIG. 4 is a view for explaining a programmable circuit and semiconductor device according to the first embodiment of the present invention, and more specifically, a circuit diagram showing the basic arrangement of the programmable circuit using the programmable element shown in FIGS. 2A and 2B.

This programmable circuit is comprised of a programmable element (a variable resistive element equivalently represented by a symbol expressing a variable resistor) 21 like the one shown in FIGS. 2A and 2B, a resistor (reference resistive element) 22 serving as a reference for an electric resistance, a comparator (comparing unit) 23, and a MOSFET (metal oxide film semiconductor element) 24 serving as a current source (current supply circuit).

The programmable element 21 and resistor 22 are connected in series between a power supply Vcc and a ground point Vss. The potential divided by the programmable element 21 and resistor 22 is compared with a reference potential Vref by the comparator 23. The resistances of the programmable element 21 and resistor 22 are designed such that the above divided potential becomes higher than the reference potential Vref in a non-programming state. One end of the current path of the MOSFET 24 is connected to the node of the programmable element 21 and resistor 22. The other end of the current path of the MOSFET 24 is connected to the ground point Vss. The MOSFET 24 is ON/OFF-controlled by supplying a program signal PRG to its gate.

In the above arrangement, programming is performed by supplying the program signal PRG to the gate of the MOSFET 24. The program signal PRG is supplied to the gate to supply a predetermined current to the programmable element 21 for a predetermined period of time, thereby self-heating the programmable element 21. When the temperature of the programmable element 21 rises to 500° C. or higher, e.g., 550° C. to 750° C., the nickel silicide film 11 undergoes phase transition to increase the resistance of the programmable element 21. As a result, after this programming, the divided potential becomes lower than the reference potential Vref, and the output of the comparator 23 is inverted.

According to the above arrangement, since programming is performed by using a change in resistance due to the phase transition of the silicide film, a programmable circuit having a programming function similar to that of a fuse element can be realized, in which the influences of programming on the neighboring elements and structure are small. In addition, there is no need to impose design limitations on portions around and above the programmable element. This makes it possible to attain a reduction in the size of a programmable circuit and an increase in packing density.

Figure 5:
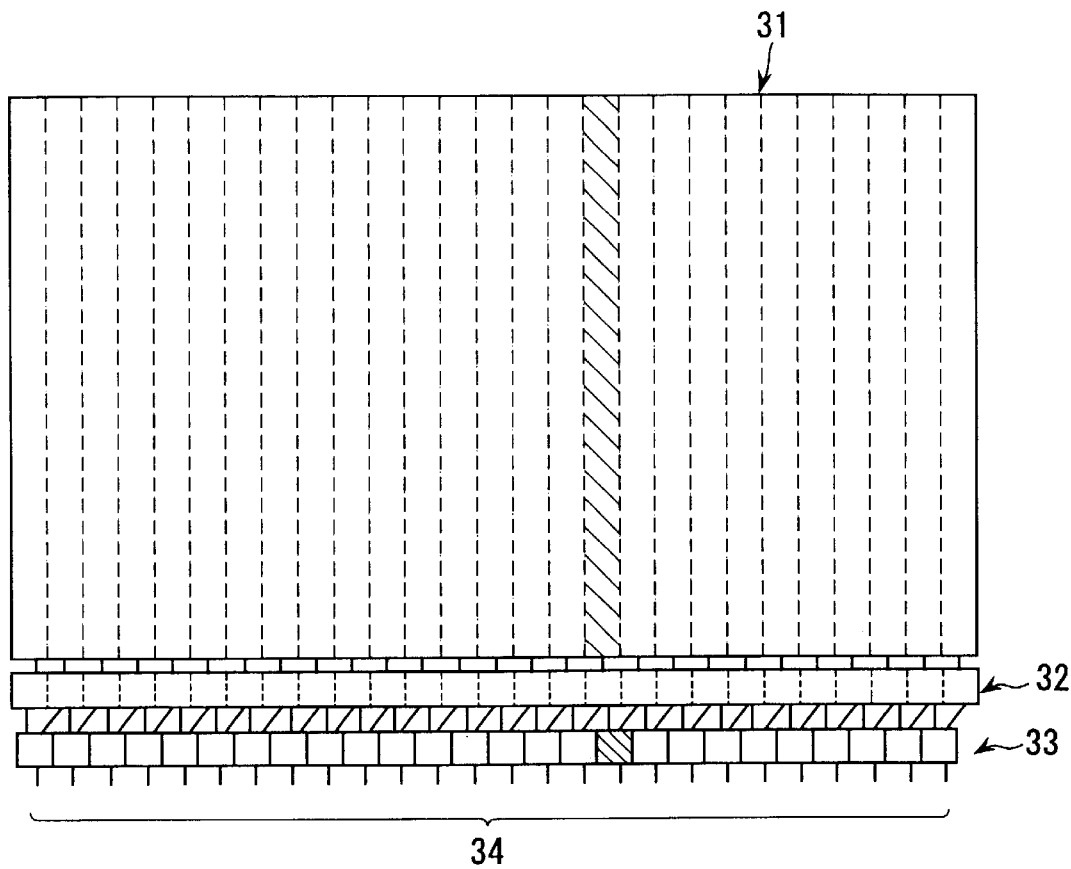
FIG. 5 is a block diagram for explaining an arrangement of a redundancy switching circuit using a programmable circuit according to an embodiment of the present invention.

FIG. 5 is a block diagram for explaining an arrangement of a redundancy switching circuit using a programmable circuit according to this embodiment of the present invention. A memory cell array 31 has memory cells arranged in the form of a matrix. In general, the vertical and horizontal lines of the above memory cells are called columns and rows. A sense amplifier array 32 and column selector array 33 are arranged adjacent to the memory cell array 31. FIG. 5 shows a case where one spare column is prepared for a predetermined storage capacity. However, more spare columns can be prepared or a spare row can be used, as needed. For the sake of descriptive convenience, redundancy in a read circuit in the column direction will be exemplified. However, redundancy in the row direction and the like can also be realized.

Figure 6:
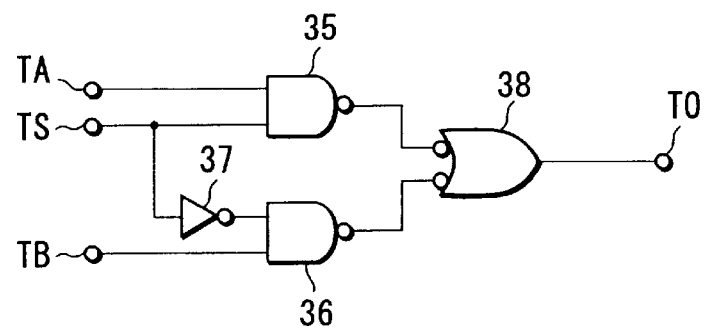
FIG. 6 is a circuit diagram showing a detailed arrangement of a column selector extracted from a column selector array in the circuit shown in FIG. 5.

FIG. 6 shows a detailed arrangement of one column selector extracted from the column selector array 33 in the circuit shown in FIG. 5. This column selector is comprised of NAND gates 35 and 36, inverter 37, and OR gate 38. One input terminal of the NAND gate 35 is connected to a terminal TA, and the other input terminal is connected to a terminal TS. The input terminal of the inverter 37 is connected to the terminal TS. One input terminal of the NAND gate 36 is connected to the output terminal of the inverter 37, and the other input terminal is connected to a terminal TB. Output signals from the NAND gates 35 and 36 are inverted and supplied to one input terminal and the other input terminal of the OR gate 38, respectively. The output terminal of the OR gate 38 is connected to a terminal TO.

In this column selector, when a "1"-level signal is supplied to the terminal TS, the same logic output as that at the terminal TA is obtained at the terminal TO. When a "0"-level signal is supplied to the terminal TS, the same logic output as that at the terminal TB is obtained at the terminal TO.

In the circuit shown in FIG. 5, the memory cells on the same column share a signal line for inputting/outputting data and are connected to one sense amplifier in the sense amplifier array 32. The column selector array 33 is an array of column selectors each having the same arrangement as that shown in FIG. 6 and designed to switch data from adjacent columns and output it as column data 34.

Assume that a circuit defect exists in the column of the memory cell array 31 which is indicated by hatching in FIG. 5. In this case, the input of the column selector on the right side of the column selector indicated by hatching in FIG. 5 is set at "0" level, while the input of the column selector on the left side is set at "1" level, thereby sequentially switching column data. This makes it possible to hold the function of the memory array by avoiding the column having the defect. At this time, for example, an input signal to the terminal TS of each column selector can be determined by an output signal from the comparator 23 in FIG. 4. Alternatively, a plurality of programmable circuits can be prepared, and the input signal can be determined by the value obtained by logic operation of output signals from the respective comparators 23 in these programmable circuits.

Figure 7:
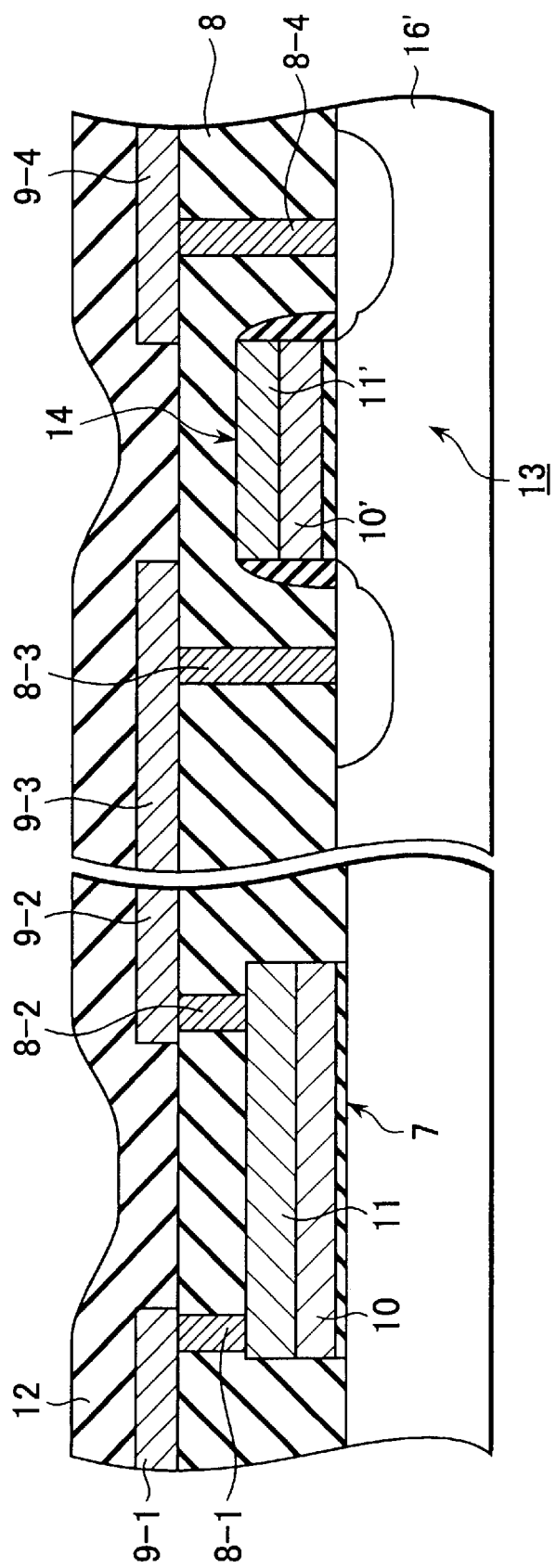
FIG. 7 is a sectional view for explaining a method of manufacturing the programmable element according to the first embodiment of the present invention.

FIG. 7 is a sectional view for explaining a method of manufacturing a programmable element according to the first embodiment of the present invention. In this case, a programmable element and a gate electrode 14 of a transistor (MOSFET) 13 which is formed in the same substrate as a semiconductor substrate 16' (chip) on which the programmable element is formed are formed by using the same material (the multilayer structure made up of a polysilicon film 10' and nickel silicide film 11') in the same process. That is, they are formed by using a manufacturing process for a MOSFET using an NiSi phase as a gate electrode.

As described above, in many integrated circuits, a low-resistance NiSi phase is formed on the surfaces of a gate electrode and source/drain diffusion layer to decrease the resistance of the electrode. Therefore, a programmable element is formed by using an NiSi phase for a reduction in the resistance of an electrode.

According to such a manufacturing method, the manufacturing process can be simplified because the process of forming a logic circuit (the gate electrode of a MOSFET) can be used to form a programmable element.

Figure 8A:
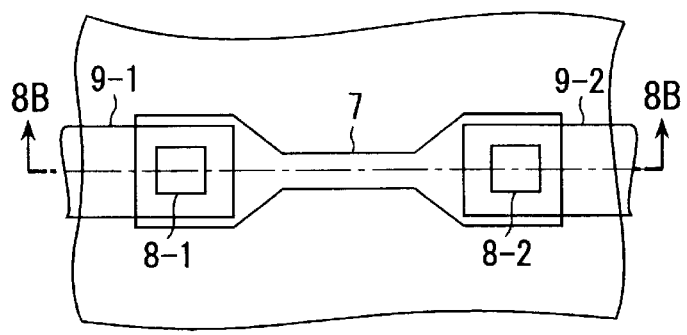
FIG. 8A is a plan view for explaining a programmable element according to the second embodiment of the present invention.
Figure 8B:
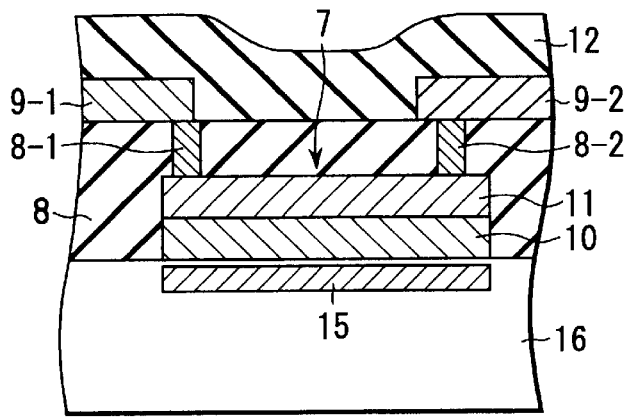
FIG. 8B is a sectional view taken along a line 8B—8B in FIG. 8A.

FIG. 8A is a plan view for explaining a programmable element according to the second embodiment of the present invention. FIG. 8B is a sectional view taken along a line 8B—8B in FIG. 8A.

This programmable element is comprised of a resistive element 7 and interconnections 9-1 and 9-2 and heating element 15 which are electrically connected to the resistive element 7. The heating element 15 is formed in a substrate 16 under the resistive element 7. The heating element 15 is energized to heat the resistive element 7 to 550° C. to 750° C. to cause phase transition. The resistive element 7 is formed by stacking a polysilicon film 10 and nickel silicide film 11. An interlevel dielectric film 8 is interposed between the resistive element 7 and the interconnections 9-1 and 9-2. One terminal of the resistive element 7 and the interconnection 9-1 are electrically connected to each other through a contact hole 8-1. The other terminal of the resistive element 7 and interconnection 9-2 are electrically connected to each other through a contact hole 8-2. The interconnections 9-1 and 9-2 are covered with a surface protective film 12.

In this arrangement as well, basically the same effects as those of the first embodiment described above can be obtained.

Figure 9A:
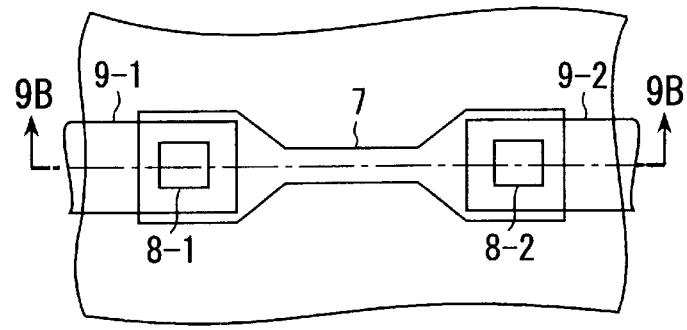
FIG. 9A is a plan view for explaining a programmable element according to the third embodiment of the present invention.
Figure 9B:
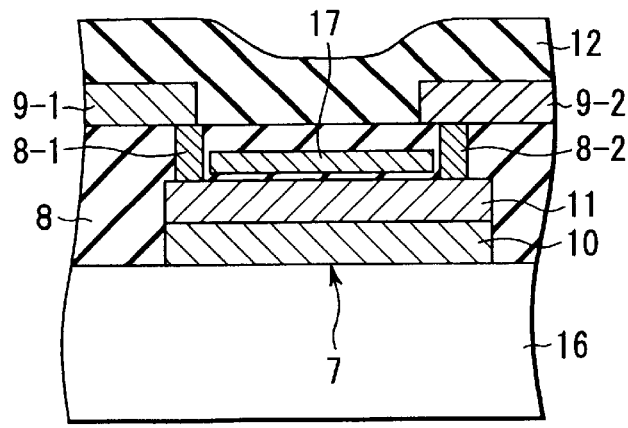
FIG. 9B is a sectional view taken along a line 9B—9B in FIG. 9A.

FIG. 9A is a plan view for explaining a programmable element according to the third embodiment of the present invention. FIG. 9B is a sectional view taken along a line 9B—9B in FIG. 9A.

This programmable element is comprised of a resistive element 7 and interconnections 9-1 and 9-2 and heating element 15 which are electrically connected to the resistive element 7. The heating element 17 is formed in a substrate 16 under the resistive element 7. The heating element 15 is energized to heat the resistive element 7 to a temperature in the range of 550° C. to 750° C. so as to cause a phase transition. The resistive element 7 is formed by stacking a polysilicon film 10 and nickel suicide film 11. An interlevel dielectric film 8 is interposed between the resistive element 7 and the interconnections 9-1 and 9-2. One terminal of the resistive element 7 and the interconnection 9-1 are electrically connected to each other through a contact hole 8-1. The other terminal of the resistive element 7 and interconnection 9-2 are electrically connected to each other through a contact hole 8-2. The interconnections 9-1 and 9-2 are covered with a surface protective film 12.

In this arrangement as well, basically the same effects as those of the first and second embodiments described above can be obtained.

The programmable circuits and semiconductor devices using the programmable elements according to the second and third embodiments can be basically realized in the same manner as for the circuit shown in FIG. 3 by making a circuit change to energize the heating element 15 or 17.

As in the arrangement shown in FIG. 6, a programmable element and the gate electrode of a transistor (MOSFET) forming a logic circuit may be formed by using the same material in the same process.

Each embodiment described above has exemplified the case where the resistive element 7 is formed by using the multilayer structure constituted by the polysilicon film 10 and nickel silicide film 11. However, the nickel silicide film 11 of the resistive element 7 can be replaced with another metal silicide film or another metal film as long as phase transition occurs to change the resistance. For example, a cobalt silicide, palladium silicide, or a metal tungsten film can be used.

As has been described above, according to one aspect of the present invention, there is provided a programmable element which can attain a reduction in size while having little influence on neighboring elements and the structure, and can realize a programming function equivalent to that of a fuse element.

In addition, there is provided a programmable circuit which exerts little influence on neighboring elements and the structure and has a programming function equivalent to that of a fuse element.

Furthermore, there is provided a semiconductor device having a programmable element which exerts little influence on neighboring elements and the structure and has a programming function equivalent to that of a fuse element.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A programmable element comprising a resistive element having a polysilicon film and a metal silicide film or metal film stacked on the polysilicon film, wherein an electric resistance of said resistive element is changed by causing the metal silicide film or metal film to undergo a phase transition without blowing the metal silicide film or metal film using heat, thereby programming on the basis of the change in the electric resistance of said resistive element.

2. The programmable element according to claim 1, wherein the heat used to cause the phase transition is heat generated by supplying a current to said resistive element.

3. The programmable element according to claim 1, wherein said element further comprises a heating element placed adjacent to said resistive element, and the heat is supplied from said heating element.

4. The programmable element according to claim 1, further comprising a first interconnection electrically connected to one terminal of said resistive element, and a second interconnection electrically connected to the other terminal of said resistive element.

5. The programmable element according to claim 4, wherein said element further comprises an insulating layer interposed between said resistive element and said first and second interconnections, said resistive element and said first interconnection are electrically connected to each other through a first contact hole formed in said insulating layer, and said resistive element and said second interconnection are electrically connected to each other through a second contact hole formed in said insulating layer.

6. The programmable element according to claim 1, wherein the metal silicide film or metal film contains a material selected from the group consisting of nickel silicide, cobalt silicide, palladium silicide, and metal tungsten.

7. The programmable element according to claim 1, wherein a temperature range that causes the phase transition is between 550° C. and 750° C. (both inclusive).

* * * * *